United States Patent [19]

Takemae et al.

[11] Patent Number: 4,486,860
[45] Date of Patent: Dec. 4, 1984

[54] SYSTEM FOR DRIVING A DYNAMIC RANDOM ACCESS MEMORY DEVICE

[75] Inventors: Yoshihiro Takemae, Tokyo; Tomio Nakano, Kawasaki, both of Japan

[73] Assignee: Fujitsu Limited, Kawasaki, Japan

[21] Appl. No.: 392,518

[22] Filed: Jun. 28, 1982

[30] Foreign Application Priority Data

Jun. 29, 1981 [JP] Japan ................................ 56/99754

[51] Int. Cl.³ .............................................. G11C 11/40
[52] U.S. Cl. ..................................... 365/222; 365/189
[58] Field of Search .............. 365/189, 222; 357/23 R

[56] References Cited

U.S. PATENT DOCUMENTS 3,737,879  6/1973  Greene et al. ...................... 365/222

Primary Examiner—Terrell W. Fears
Attorney, Agent, or Firm—Staas & Halsey

[57] ABSTRACT

In a dynamic random access memory device, the memory cells, sense amplifiers, word drivers, and the like are divided into a plurality of blocks. During the access mode, only one of the blocks in which a desired row exists is driven while, during the refresh mode, all of the blocks are driven.

4 Claims, 11 Drawing Figures

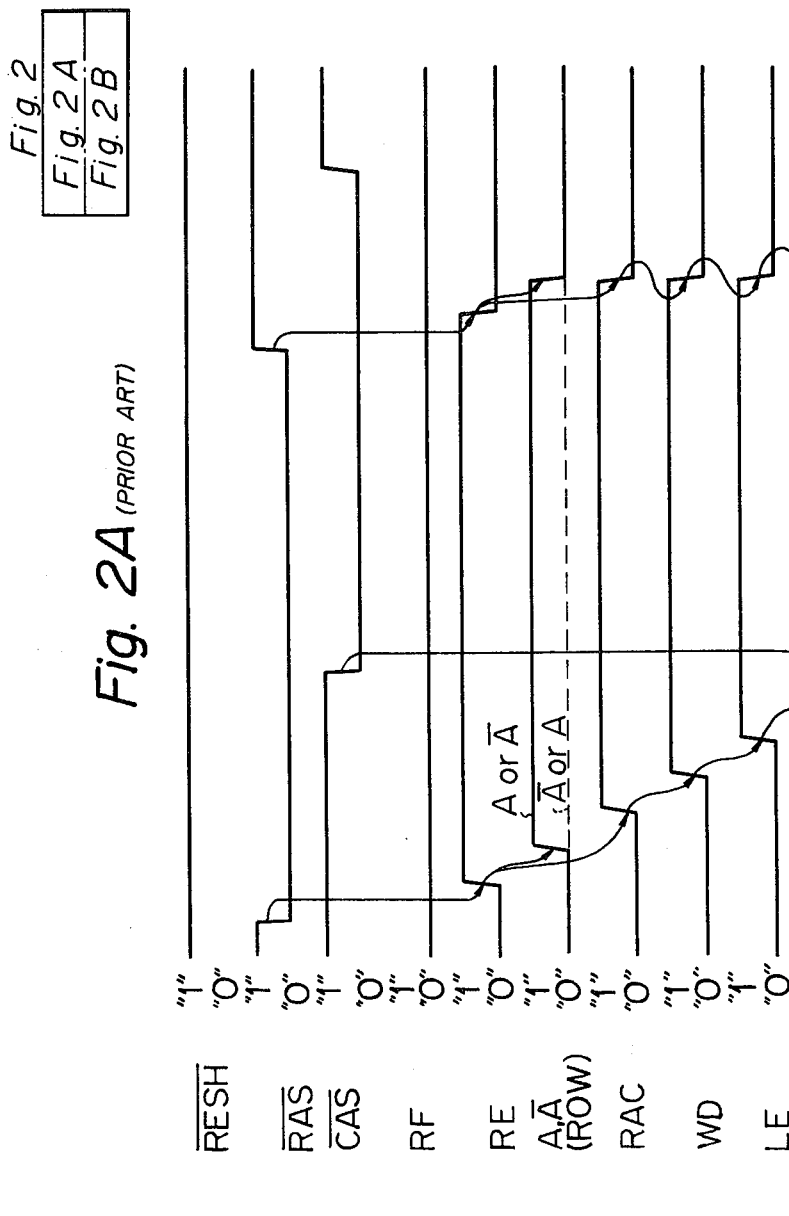

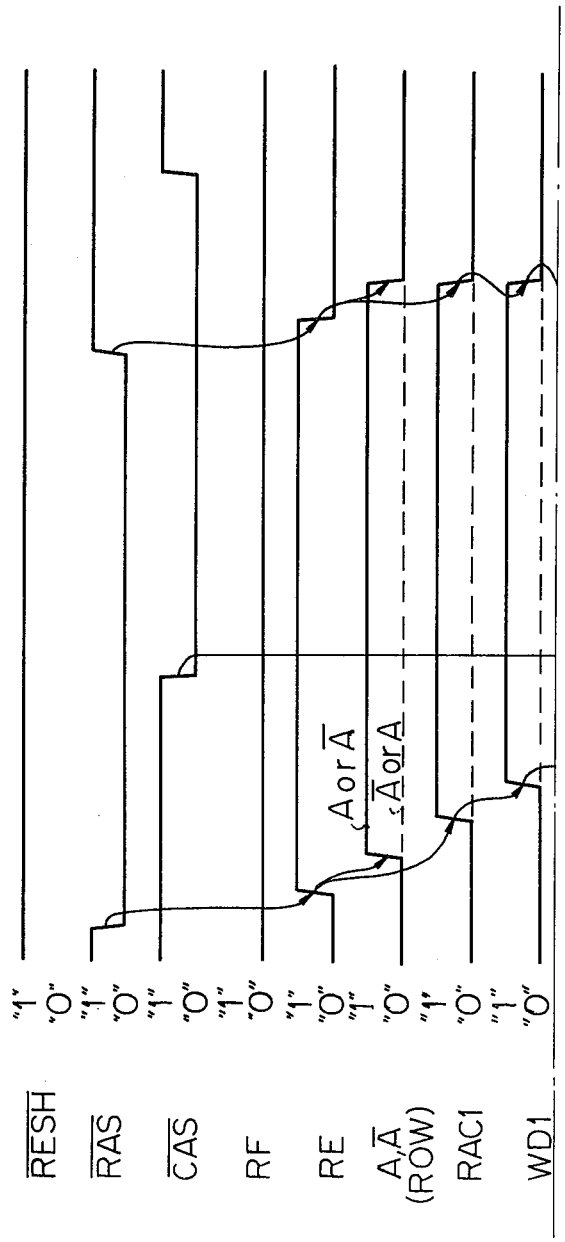

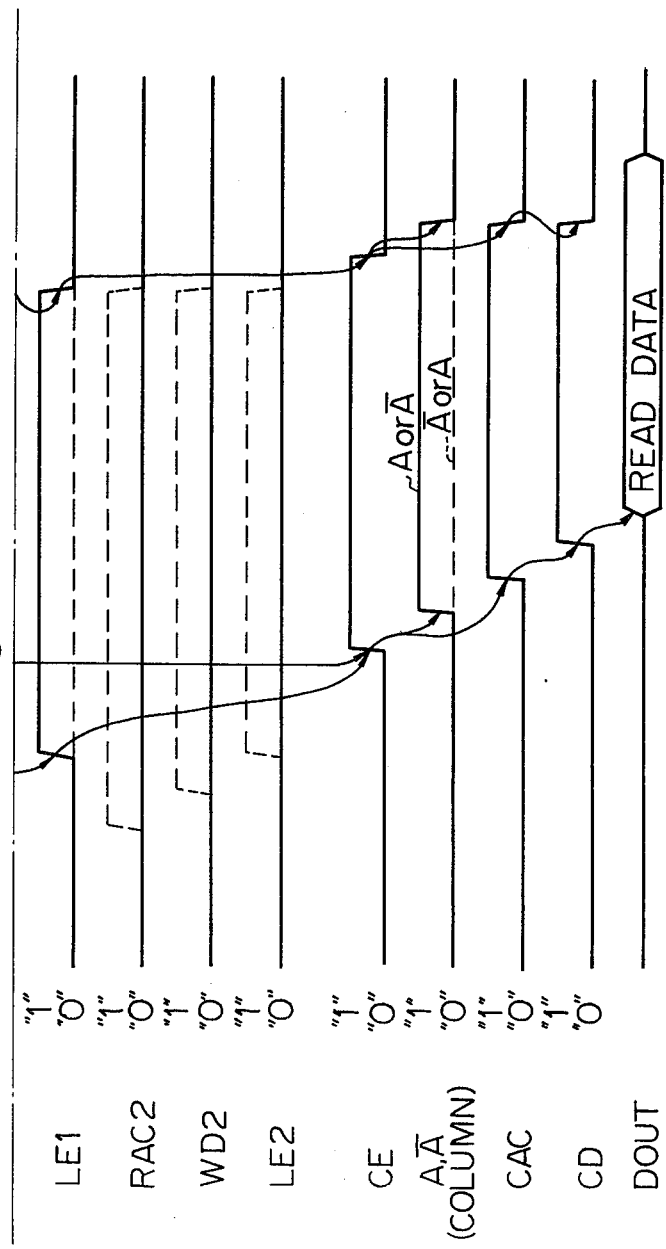

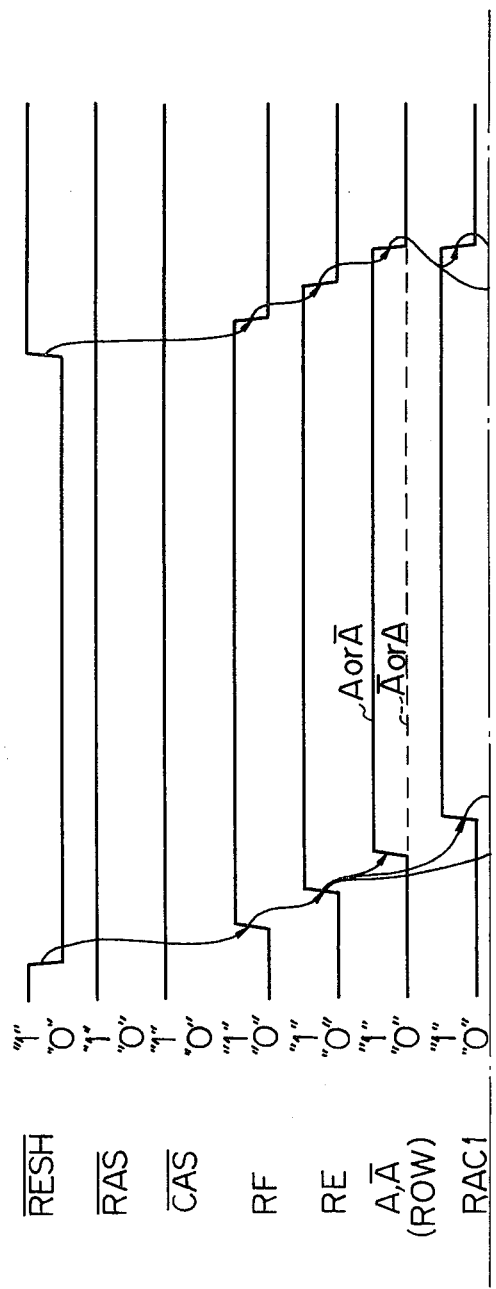

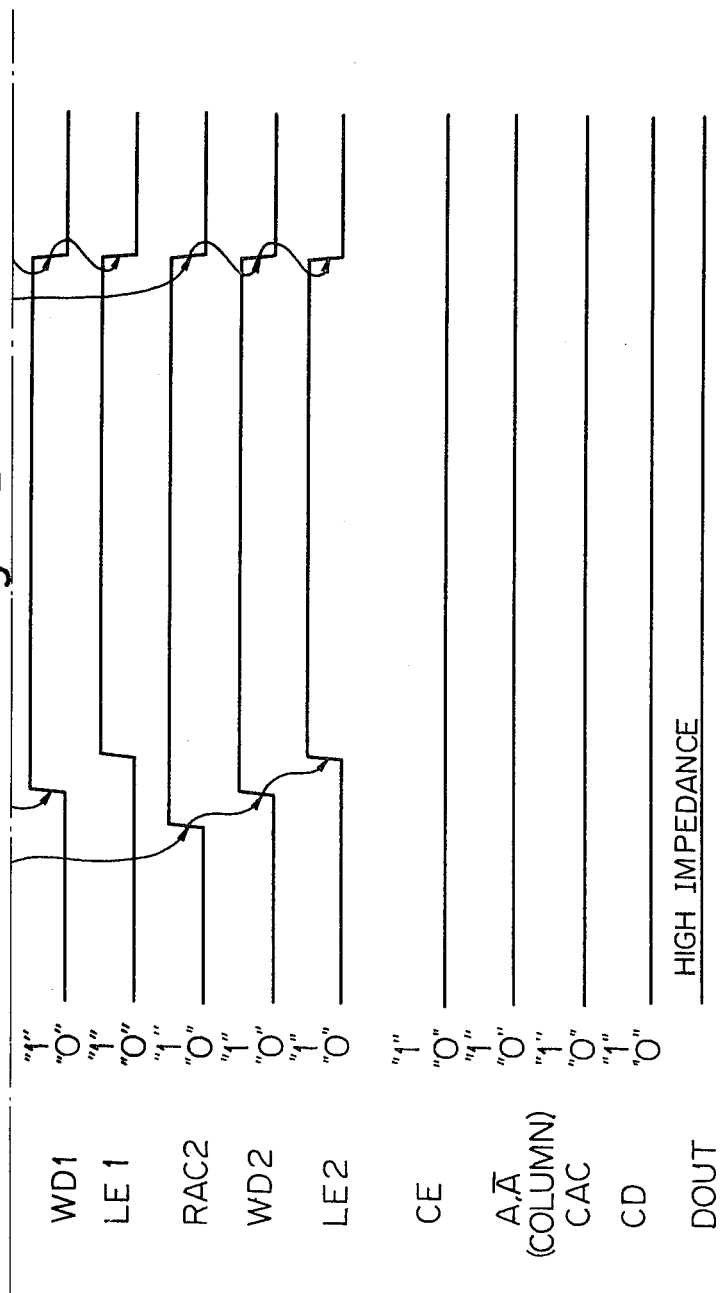

SYSTEM FOR DRIVING A DYNAMIC RANDOM ACCESS MEMORY DEVICE

BACKGROUND OF THE INVENTION

1. Field of the Invention

The present invention relates to a dynamic metal-oxide semiconductor (MOS) random access memory (RAM) device and, more particularly, to a system for driving a dynamic RAM device.

2. Description of the Prior Art

In recent years, dynamic MOS RAM devices have been enlarged from 16 kbits (precisely, 16,384 bits) to 64 kbits (precisely 65,536 bits). Thus, as the integration density has become high, the number of memory cells connected to one sense amplifier for the read operation has become higher and, accordingly, the load of each sense amplifer has also become higher. In order to reduce the load of each sense amplifier, for example, in a prior art 64 kbit MOS RAM device, two series of sense amplifiers are provided, and a 16 kbit memory cell array is arranged on both sides of each series of sense amplifiers. Therefore, the memory cells, sense amplifiers, row address decoders, and the like are divided into two blocks.

In a block-divided 64 K device, during the access mode, for example, for the read operation, one row is selected from each block by using row address signals $A_0$, $\overline{A_0}$, $A_1$, $\overline{A_1}$, ..., $A_6$, and $\overline{A_6}$, that is, two rows are selected. In addition, one of the two rows is selected in an output portion by using row address signals $A_7$ and $\overline{A_7}$. Simultaneously, one column is selected from the memory cells by using a set of column address signals $A_0$, $\overline{A_0}$, $A_1$, $\overline{A_1}$, ..., $A_7$ and $\overline{A_7}$ which multiplex the row address signals.

On the other hand, during the refresh mode, which is indispensible for a dynamic device, the selection of columns is unnecessary, and, accordingly, the above-mentioned selection carried out by the row address signals $A_7$ and $\overline{A_7}$ and by the column address signals $A_0$, $\overline{A_0}$, $A_1$, $\overline{A_1}$, ..., $A_7$ and $\overline{A_7}$ is not performed.

In the above-mentioned prior art device, however, since all of a plurality of blocks, which is for example, two blocks, is selected to operate when a row is selected during the access mode, the power dissipation of the device is large.

SUMMARY OF THE INVENTION

It is, therefore, an object of the present invention to provide a system for driving a dynamic RAM device in which the power dissipation is small.

According to the present invention, there is provided a system for driving a dynamic RAM device having a plurality of blocks, each of said plurality of blocks including memory cells arranged in rows and columns, with word decoders connected to the rows and sense amplifiers and column decoders connected to the columns, comprising: a first generating means for generating a row enable signal during an access mode in which one of said memory cells is accessed; a second generating means for generating a column enable signal during the access mode; a third generating means for generating a refresh control signal during a refresh mode in which said memory cells are refreshed; a row-selecting means, connected to the first and second generating means, for receiving the row enable signal and for supplying a first part of row address signals to select one row of each block to the word decoders, the row-selecting means generating a plurality of row address clock signals corresponding to each block in accordance with a second part of the row address signals and the refresh control signal; a block activating means, connected to the row-selecting means and to the blocks, for receiving the row address clock signals to activate one of the blocks during the access mode and to activate all of the blocks during the refresh mode; a column-selecting means, connected to the third generating means, for supplying column address signals to the column decoders, so that one column of each block is selected during the access mode, the column-selecting means being disabled by the refrech control signal during the refresh mode.

The present invention will be more clearly understood from the description as set forth below contrasting the present invention with the prior art and referring to the accompanying drawings.

BRIEF DESCRIPTION OF THE DRAWINGS

FIG. 2, including FIGS. 2A and 2B, is a timing diagram of the signals appearing in the circuit of FIG. 1 for explaining the access mode;

FIG. 3, including

FIG. 5, including FIGS. 5A and 5B, is a timing diagram of the signals appearing in the circuit of FIG. 4 for explaining the access mode;

FIG. 6, including FIGS. 6A and 6B, is a timing diagram of the signals appearing in the circuit of FIG. 4 for explaining the refresh mode.

DESCRIPTION OF THE PREFERRED EMBODIMENT

Figure 1:
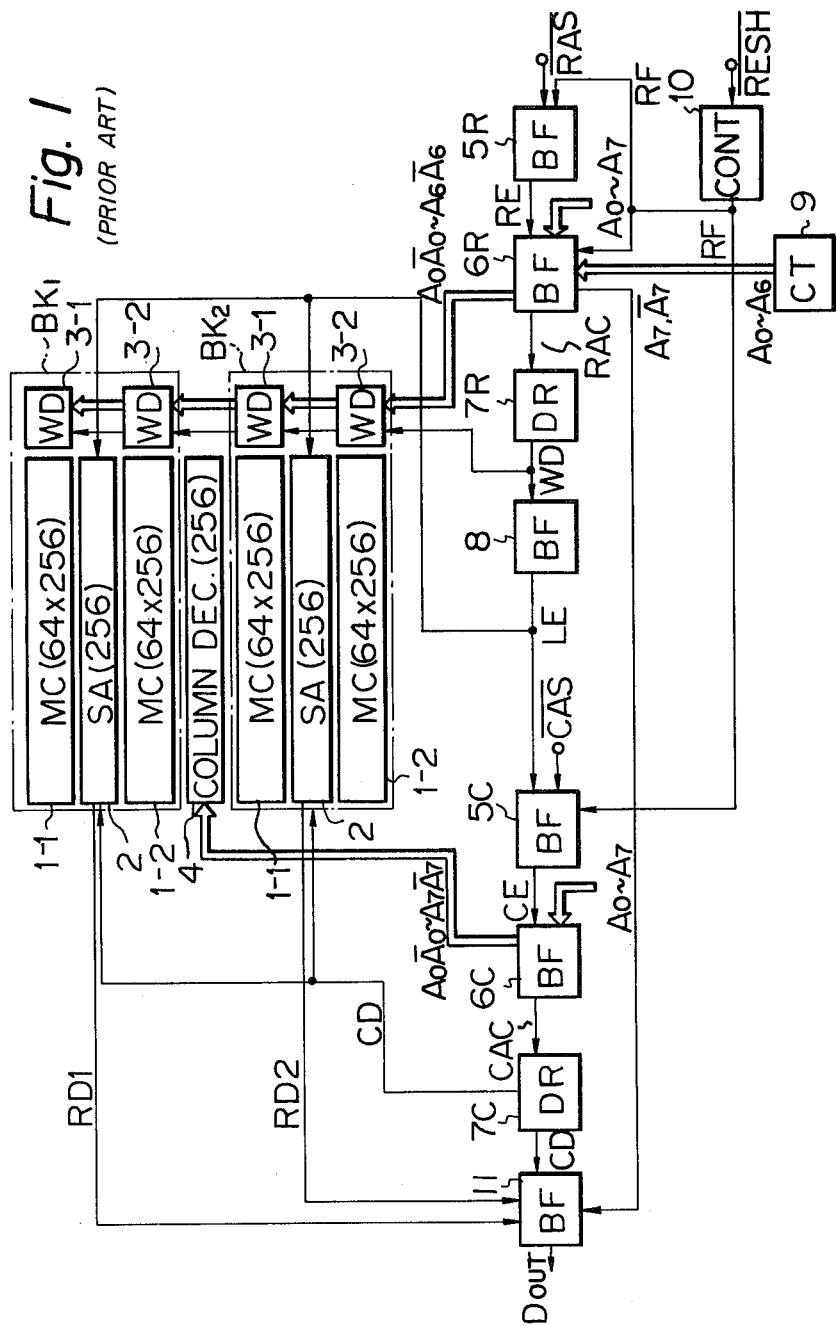
FIG. 1 is a block circuit diagram illustrating one prior art system for driving a dynamic RAM device.
Figure 2B:
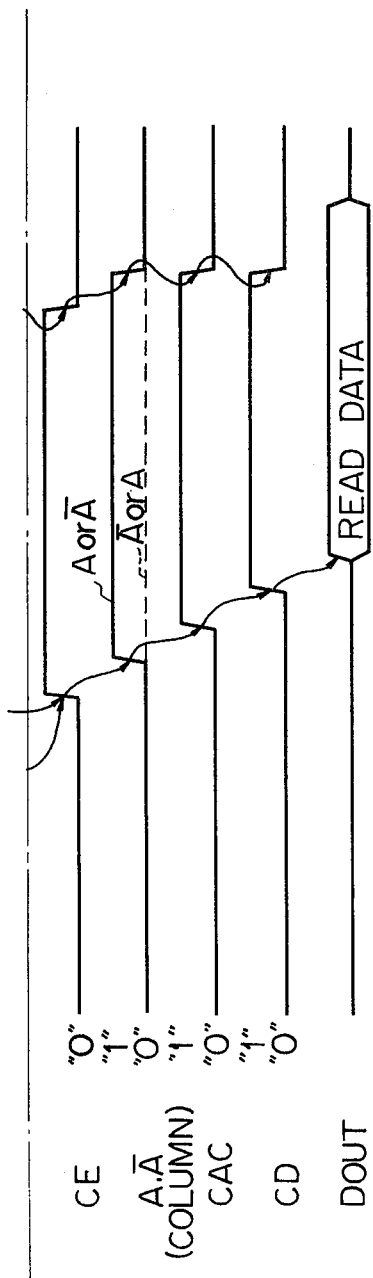
Figure 3A:
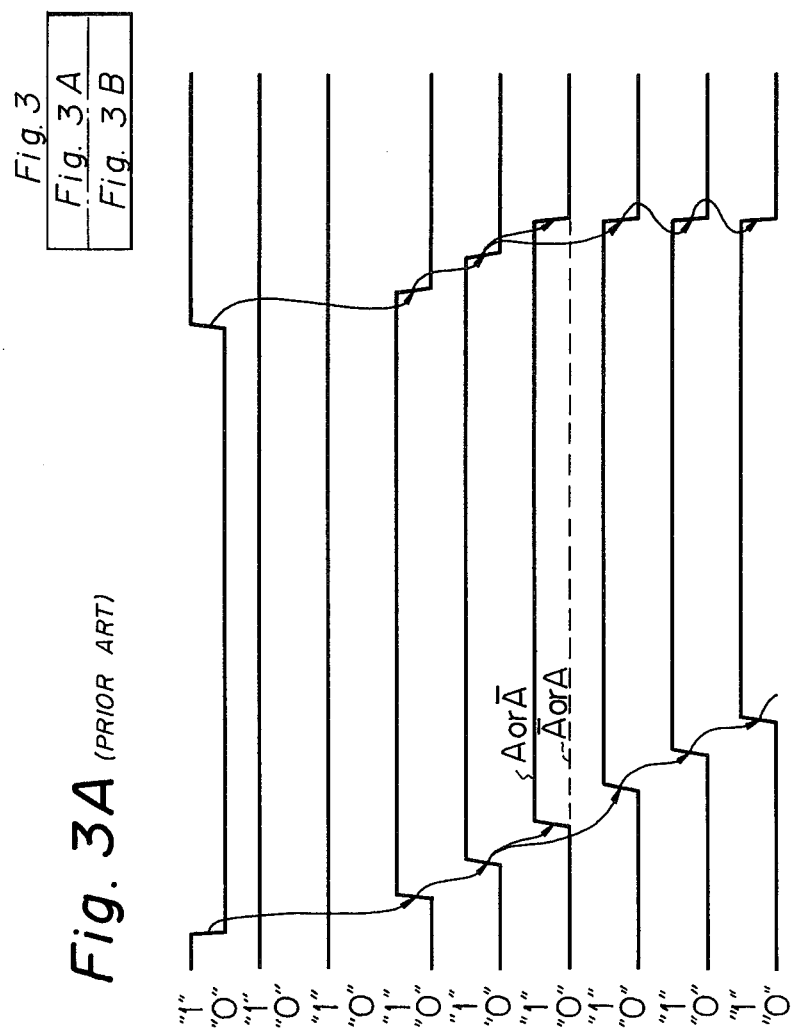
FIGS. 3A and 3B, is a timing diagram of the signals appearing in the circuit of FIG. 1 for explaining the refresh mode.
Figure 3B:
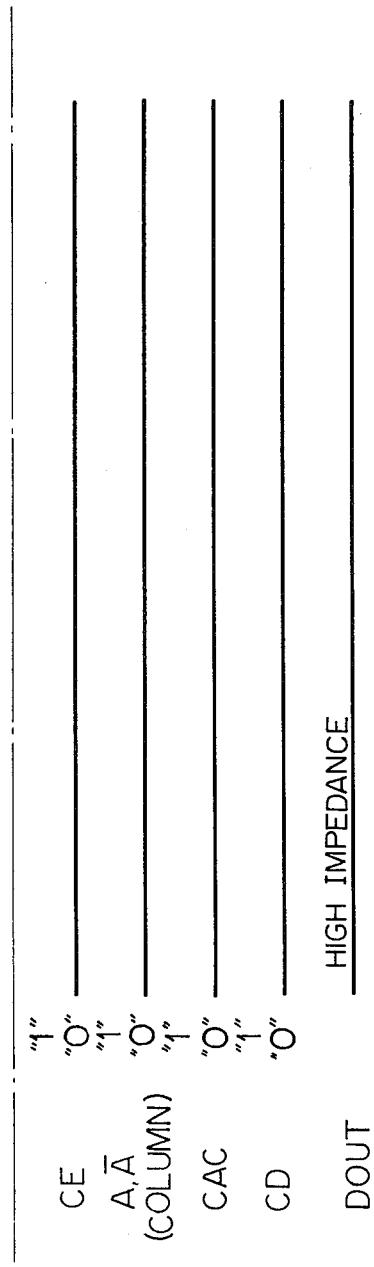

First, one prior art system for driving a dynamic RAM device will now be explained with reference to FIGS. 1 through 3. In FIG. 1, a 64 kbit RAM device divided into two blocks is illustrated. Each of the blocks $BK_1$ and $BK_2$ comprises two memory cell arrays 1-1 and 1-2, each array including 16 kbit (64×256) memory cells, a series of 256 sense amplifiers 2 arranged between the memory cell arrays 1-1 and 1-2, and word decoder portions 3-1 and 3-2. The word decoder portions 3-1 and 3-2 are used for selecting one of 128 rows specified by a logic combination of the row address signals $A_0$ and $\overline{A_0}$ through $A_6$ and $\overline{A_6}$. In this case, the word decoder portions 3-1 and 3-2 include word drivers which are clocked by a word line driving signal WD.

The selection of one of the 128 rows of each block is carried out by a row enable buffer 5R, a row address buffer 6R, a word line driver 7R, and a latch enable buffer 8.

In more detail, the row enable buffer 5R converts a row address strobe signal $\overline{RAS}$ of a transistor-transistor logic (TTL) level from the exterior of the device into a row enable signal RE of a MOS level. During the access mode, the row address buffer 6R converts the row address signals $A_0$ through $A_7$ of a TTL level from the exterior of the device into the row address signals $A_0$, $\overline{A}_0$ through $A_7$, $\overline{A}_7$ of a MOS level. This conversion is clocked by the row enable signal RE from the row enable buffer 5R. However, during the refresh mode, the row address buffer 6R converts the row address signals $A_0$ through $A_6$ from a refresh address counter 9 into the row address signals $A_0$, $\overline{A}_0$ through $A_6$, $\overline{A}_6$ of a MOS level. This conversion is clocked by a refresh clock signal RF of a refresh control circuit 10. Simultaneously, the row address buffer 6R generates a row address clock signal RAC by using the row enable signal RE. The word line driver 7R generates a word line driving signal WD by using the row address clock signal so as to clock all of the word decoder portions 3-1 and 3-2. The latch enable buffer 8 generates a latch enable signal LE by using the word line driving signal WD so as to activate all of the sense amplifiers 2.

The selection of one of the 256 columns of each block is performed by a column enable buffer 5C, a column address buffer 6C, and a column line driver 7C. This column selection is performed after row selection since the column enable buffer 5C is clocked by the latch enable signal LE of the latch enable buffer 8. Note that, during the refresh mode, the refresh clock signal RF disables the column enable buffer 5C, so that column selection is not performed.

In more detail, the column enable buffer 5C generates a column enable signal CE by using the latch enable signal LE and a column address strobe signal $\overline{CAS}$ from the exterior of the device when the refresh clock signal RF is at the logic "0" level, which means the access mode. The column address buffer 6C converts the column address signals $A_0$ through $A_7$ of a TTL level from the exterior of the device into the column address signals $A_0$ and $\overline{A}_0$ through $A_7$ and $\overline{A}_7$ of a MOS level, so that the column decoders 4 select one column from each block $BK_1$ and $BK_2$. This conversion is clocked by the column enable signal CE from the column enable buffer 5C. Simultaneously, the column address buffer 6C generates a column address clock signal CAC by using the column enable signal CE, and the column line driver 7C generates a column driving signal CD by using the column address clock signal CAC. That is, column selection is performed in each of the blocks $BK_1$ and $BK_2$, and, accordingly, two types of read data RD1 and RD2 are transmitted from the blocks $BK_1$ and $BK_2$, respectively, to a data buffer 11. In the data buffer 11, one of the two types of read data is selected in accordance with the row address signal $A_7$ and $\overline{A}_7$, and, accordingly, the selected data is transmitted as output data $D_{out}$ to the exterior of the device.

The access mode of the circuit of FIG. 1 will be explained with reference to FIG. 2. In this the access mode, the refresh signal $\overline{RESH}$ remains at the logic "1" level. When the row address strobe signal $\overline{RAS}$ is changed from the logic "0" level to the logic "1" level, the timing signals for row selection, that is, the row enable signal RE, the row address clock signal RAC, the word line driving signal WD, and the latch enable signal LE, respectively, change their levels. Therefore, supply of the row address signals $A_0$ and $\overline{A}_0$ through $A_6$ and $\overline{A}_6$ to the word decoder portions 3-1 and 3-2 clocked by the row enable signal RE, activation of the word decoder portions 3-1 and 3-2 clocked by the word line driving signal WD, and activation of the sense amplifiers 2 clocked by the latch enable signal LE, respectively, are performed. After that, when the column address selection signal $\overline{CAS}$ is changed from the logic "1" level to the logic "0" level, the timing signals for column selection, that is, the column enable signal CE, the column address clock signal CAC, and the column line driving signal CD, respectively, change their levels. Therefore, supply of the column address signals $A_0$ and $\overline{A}_0$ through $A_7$ and $\overline{A}_7$ to the column decoders 4 clocked by the column enable signal CE and transmission of the read data clocked by the column line driving signal CD are performed, so that the output data $D_{out}$ in accordance with the row address signals $A_7$ and $\overline{A}_7$ is obtained.

The refresh operation of the circuit of FIG. 1 will be explained with reference to FIG. 3. In this refresh mode, the row address strobe signal $\overline{RAS}$ and the column address strobe signal $\overline{CAS}$ remain at the logic "1" level. When the refresh signal $\overline{RESH}$ is changed from the logic "1" level to the logic "0" level, and, accordingly, the refresh control circuit 10 changes the refresh clock signal RF from the logic "0" level to the logic "1" level, the timing signals for row selection, which are the same as in the access mode, also change their levels. In this case, in the row address buffer 6R, the input row address signals $A_0$ through $A_7$ from the exterior of the device are switched to the input row address signals $A_0$ through $A_6$ from the refresh address counter 9 by the refresh clock signal RF. Therefore, supply of the row address signals $A_0$ and $\overline{A}_0$ through $A_6$ and $\overline{A}_6$ (which are, in this case, derived from the refresh address counter 9) to the word decoder portions 3-1 and 3-2 clocked by the row enable signal RE, activation of the word decoder portions 3-1 and 3-2 clocked by the word line driving signal WD, and activation of the sense amplifiers 2 clocked by the latch enable signal LE, respectively, are performed. However, since the refresh clock signal RF is at the logic "1" level, the timing signals, such as CE, CAC and CD, for column selection do not change their levels. As a result, no output data $D_{out}$ is obtained.

In FIG. 1, during the access mode, even if one memory cell of the block $BK_1$ is selected, the block $BK_2$, in addition to the block $BK_1$, is also driven. That is, the word decoder portions 3-1 and 3-2 of the block $BK_2$ and the sense amplifiers 2 of the block $BK_2$ are activated, and, accordingly, the power dissipation is large.

Contrary to the above, in the present invention, if one memory cell of the block $BK_1$ is selected, only the block $BK_1$ is driven. That is, the word decoder portions 3-1 and 3-2 of the block $BK_2$ and the sense amplifiers 2 of the block $BK_2$ are not activated, and, accordingly, the power dissipation is small.

Figure 4:
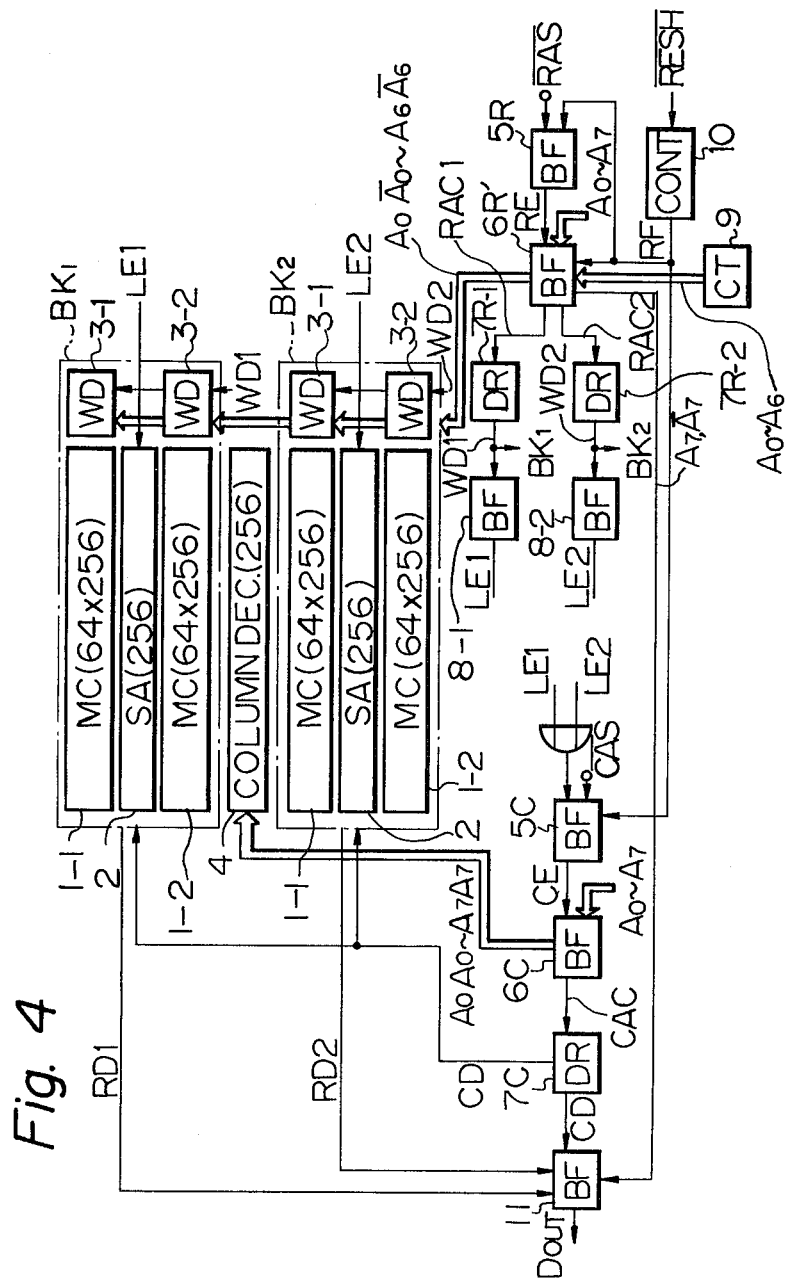
FIG. 4 is a block circuit diagram illustrating an embodiment of the system for driving a dynamic RAM device according to the present invention.

FIG. 4 is a block circuit diagram illustrating an embodiment of the system for driving a dynamic RAM device according to the present invention. In FIG. 4, the elements which are the same as those of FIG. 1 are denoted by the same reference numerals. The row address buffer 6R' of FIG. 4 can generate two row address clock signals RAC1 and RAC2. That is, during the access mode, the row address buffer 6R' generates either the row address clock signal RAC1 or the row address clock signal RAC2 in accordance with the row address signals $A_7$ and $\overline{A}_7$, while during the refresh mode, the row address buffer 6R' generates both of the row address clock signals RAC1 and RAC2.

A word line driver 7R-1 and a latch enable buffer 8-1 are provided for selecting a row from the block $BK_1$. In more detail, the word line driver 7R-1 is used for activating the word decoder portions 3-1 and 3-2 of the block $BK_1$, and the latch enable buffer 8-1 is used for activating the sense amplifiers of the block $BK_1$. Similarly, a word line driver 7R-2 and a latch enable buffer 8-2 are provided for selecting a row from the block BK$_2$. However, it should be noted that each of the word line drivers 7R-1 and 7R-2 has the same construction as the word line driver 7R of FIG. 1 and each of the latch enable buffers 8-1 and 8-2 has the same construction as the latch enable buffer 8 of FIG. 1.

The access mode of the circuit of FIG. 4 will be explained with reference to FIG. 5. Assuming that one row is selected from the block BK$_1$, in this access mode, the refresh signal $\overline{RESH}$ remains at the logic "1" level. When the row address strobe signal $\overline{RAS}$ is changed from the logic "1" level to the logic "0" level, the row enable buffer 5R generates a row enable signal RE to the row address buffer 6R'. In turn, the row address buffer 6R' transmits the row address signals A$_0$ and $\overline{A_0}$ through A$_6$ and $\overline{A_6}$ to the word decoder portions 3-1 and 3-2 of both of the blocks BK$_1$ and BK$_2$. In addition, the row address buffer 6R' generates only one row address clock signal RAC1 to the word line driver 7R-1, which, in turn, generates a word line driving signal WD1 to the word decoder portions of the block BK$_1$ and to the latch enable buffer 8-1. Therefore, the word decoder portions 3-1 and 3-2 of only the block BK$_1$ are activated. In addition, the latch enable buffer 8-1 activates the sense amplifiers 2 of the block BK$_1$. Thus, only the block BK$_1$ is driven. After that, when the column address selection signal $\overline{CAS}$ is changed from the logic "1" level to the logic "0" level, the column enable buffer 5C receives the latch enable signal LE1, so that the circuits 5C, 6C, 7C, and 11 for column selection operate in the same way as in FIG. 1.

The refresh mode of FIG. 4 will be explained with reference to FIG. 6. In this refresh mode, the row address strobe signal $\overline{RAS}$ and the column address strobe signal $\overline{CAS}$ remain at the logic "1" level. When the refresh signal $\overline{RESH}$ is changed from the logic "1" level to the logic "0" level, the refresh control circuit 10 changes the level of the refresh clock signal RF so as to operate the row enable buffer 5R and, simultaneously, to disable the column enable buffer 5C. In addition, in the row address buffer 6R', the input row address signals A$_0$ through A$_7$ from the exterior of the device are switched to the input row address signals A$_0$ through A$_6$ from the refresh address counter 9 by the refresh clock signal RF. Next, the row enable buffer 5R generates a row enable signal RE to the row address buffer 6R'. In turn, the row address buffer 6R' transmits the row address signals A$_0$ and $\overline{A_0}$ through A$_6$ and $\overline{A_6}$ to the word decoder portions 3-1 and 3-2 of both of the blocks BK$_1$ and BK$_2$. In addition, the row address buffer 6R' generates both of the row address clock signals RAC1 and RAC2. Therefore, both of the word line drivers 7R-1 and 7R-2 generate the word line driving signals WD1 and WD2 to activate the word decoder portions 3-1 and 3-2 of both of the blocks BK$_1$ and BK$_2$. In addition, both of the latch enable buffers 8-1 and 8-2 receive the word line driving signals WD1 and WD2, respectively, to activate the sense amplifiers 2 of both of the blocks BK$_1$ and BK$_2$. That is, the refresh mode for the memory cells of the blocks BK$_1$ and BK$_2$ is the same as that of FIG. 1.

Figure 7:
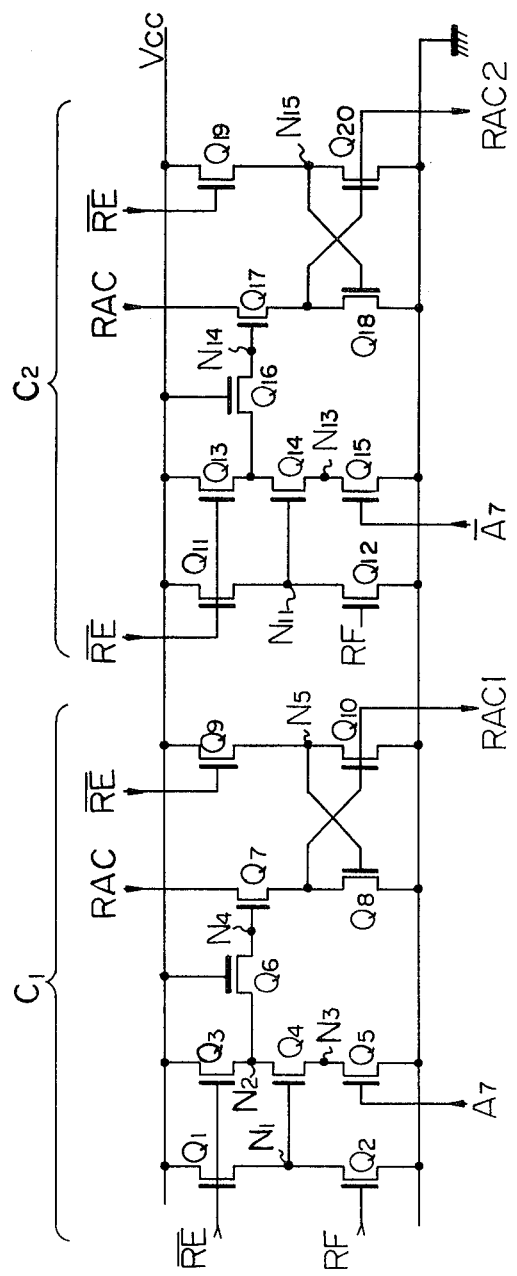
FIG. 7 is a partial circuit diagram of the row address buffer of FIG. 4.

The row address buffer 6R' for generating the row address clock signals RAC1 and RAC2 will be explained with reference to FIG. 7. In FIG. 7, the circuit for generating the row address signals A$_0$ and $\overline{A_0}$ through A$_6$ and $\overline{A_6}$ is omitted. A row address clock signal generating circuit C$_1$, is provided for receiving a row address clock signal RAC (which is the same as the signal RAC of FIG. 1), a row enable signal $\overline{RE}$ (precisely, its inverted signal), a refresh clock signal RF, and a row address signal A$_7$ to generate a row address clock signal RAC1. In addition, a row address clock signal generating circuit C$_2$ is provided for receiving the row address clock signal RAC, the row enable signal $\overline{RE}$, the refresh clock signal RF, and a row address signal $\overline{A_7}$ to generate a row address clock signal RAC2. The clock signal circuit C$_1$, formed of the transistors Q$_1$ through Q$_{10}$ has the same construction as the clock signal circuit C$_2$ formed of the transistors Q$_{11}$ through Q$_{20}$. Clock signal circuit C$_1$ includes a control circuit comprising transistors Q$_1$–Q$_6$ and a gate circuit comprising transistors Q$_7$–Q$_{10}$, while clock signal circuit C$_2$ includes an identical circuit structure.

For example, in the clock signal circuit C$_1$, during the standby mode, since the signal $\overline{RE}$ is at the logic "1" level (high), the nodes N$_1$, N$_2$, N$_3$, N$_4$ and N$_5$ are charged. Next, in the active mode the signal $\overline{RE}$ becomes the logic "0" level (low), and in addition, since the gate potential (the potential at the node N$_1$) of the transistor Q$_4$ is high, the potential at the node N$_2$ is determined by the high or low potential of the signal A$_7$. For example, if the signal A$_7$ is at the logic "1" level (high), the potential at the node N$_2$ becomes low, and, accordingly, the potential at the node N$_4$ becomes low. Therefore, the signal RAC cannot pass through the transistor Q$_7$. However, if the signal A$_7$ is at the logic "0" level (low), the potential at the node N$_2$ remains high, and, accordingly, the potential at the node N$_4$ also remains high. Therefore, the signal RAC passes through the transistor Q$_7$, and, as a result, the signal RAC becomes the signal RAC1. In addition, during the refresh mode, the signal RF becomes the logic "1" level (high). As a result, the node N$_1$ is discharged, and, accordingly, the potential at the node N$_2$ remains high regardless of the potential of the signal A$_7$. Therefore, the signal RAC passes through the transistor Q$_7$, so that the signal RAC becomes the signal RAC1.

In the same way in the clock signal circuit C$_2$, during the active mode and, simultaneously, during the access mode, the signal RAC passes through the transistor Q$_{17}$ in accordance with the signal $\overline{A_7}$, so that the signal RAC becomes the signal RAC2. In addition, during the refresh mode, the signal RAC passes through the transistor Q$_{17}$ regardless of the potential of the signal $\overline{A_7}$, so that the signal RAC becomes the signal RAC2.

In the above-mentioned embodiment, a 64 kbit memory device is illustrated. However, the present invention is not limited to the number of memory cells. In addition, the present invention can be applied to a dynamic RAM device in which memory cells, sense amplifiers, word decoders, and the like are divided into, for example, two blocks, the blocks capable of being N blocks.

As explained hereinbefore, the dynamic RAM device according to the present invention is advantageous in that the power dissipation is low. This is because during the access mode, only the word decoder portions of a block in which a desired row exists are operated, so that the power dissipation of the word decoder portions can be reduced. In addition, only the sense amplifiers of such a block are operated, which also decreases the power dissipation. For example, if the device is divided into two blocks, the power dissipated in the word decoder portions and in the sense amplifier portions can be reduced by about one half. In addition, during the refresh mode, the divided blocks are both operated, but the circuits on the column side are not operated. Therefore, in this case, the power dissipation is reduced.

We claim:

1. A system for driving a dynamic random access memory device having a plurality of blocks, each of said plurality of blocks including memory cells arranged in rows and columns, with word decoders connected to said rows and sense amplifiers and column decoders connected to said columns, and receiving row address signals having a first and second part, comprising:

first generating means for generating a row enable signal during an access mode in which one of said memory cells is accessed;

second generating means for generating a column enable signal during the access mode;

third generating means for generating a refresh control signal during a refresh mode in which said memory cells are refreshed;

row selecting means, operatively connected to said first and third generating means and to receive the row address signals, for receiving said row enable signal, for supplying the first part of row address signals to select one row of each block to said word decoders and for generating a plurality of row address clock signals corresponding to each block in accordance with the second part of the row address signals, the row enable signal and said refresh control signal;

block-activating means, operatively connected to said row-selecting means and to said blocks, for receiving said row address clock signals to activate one of said blocks during the access mode and to activate all of said blocks during the refresh mode; and column-selecting means, operatively connected to said third generating means, for supplying column address signals to said column decoders so that one column of each block is selected during the access mode, said column-selecting means being disabled by said refresh control signal during the refresh mode.

2. A system as set forth in claim 1, wherein said block-activating means comprises:

a plurality of word line drivers, each of said plurality of word line drivers operatively connected to said row-selecting means and to one of said blocks and receiving one of said row address clock signals and generating a word line driving signal to activate the word decoders of one of said blocks; and a plurality of latch enable buffers, each of said plurality of latch enable buffers being operatively connected to said one of said word line drivers and to said column selecting means, and receiving a respective word line driving signal and generating a latch enable signal to activate the sense amplifiers of one of said blocks.

3. A system as set forth in claim 1, wherein said row selecting means comprises first and second row address clock signal generating circuits each operatively connected to said first generating means, said third generating means, said block-activating means and to receive the second part of the row address signals.

4. A system as set forth in claim 3, wherein said first and second address clock signal generating circuits each comprise:

a control circuit operatively connected to said first generating means, said third generating means and to receive the second part of the row address signal, for generating a control signal; and a gate circuit, operatively connected to said control circuit and said first generating means, for generating one of the row address clock signals in dependence upon the control signal and the row enable signal.

* * * * *

UNITED STATES PATENT AND TRADEMARK OFFICE
CERTIFICATE OF CORRECTION

PATENT NO. : 4,486,860
DATED : DECEMBER 4, 1984
INVENTOR(S) : YOSHIHIRO TAKEMAE ET AL.

It is certified that error appears in the above-identified patent and that said Letters Patent is hereby corrected as shown below:

Col. 2, line 13, "refrech" should be --refresh--.

Col. 3, line 55, "0" should be --1--; and

"1" should be --0--.

Signed and Sealed this

Twentieth Day of August 1985

[SEAL]

Attest:

DONALD J. QUIGG

Attesting Officer        Acting Commissioner of Patents and Trademarks